United States Patent
Jain et al.

(10) Patent No.: US 6,417,092 B1
(45) Date of Patent: Jul. 9, 2002

(54) LOW DIELECTRIC CONSTANT ETCH STOP FILMS

(75) Inventors: Sanjeev Jain, Santa Clara; Somnath Nag, Saratoga; Gerrit Kooi, Sunnyvale; M. Ziaul Karim, San Jose; Kenneth P. MacWilliams, Los Gatos, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/543,149

(22) Filed: Apr. 5, 2000

(51) Int. Cl.$^7$ ......................................... H01L 21/4763
(52) U.S. Cl. ..................................... 438/624; 257/635
(58) Field of Search ................................. 438/624, 780, 438/781, 789; 257/635, 636, 642, 77, 295

(56) References Cited

U.S. PATENT DOCUMENTS

| | | | |
|---|---|---|---|
| 5,103,285 A | | 4/1992 | Furumura et al. ............. 357/68 |
| 5,818,071 A | * | 10/1998 | Loboda et al. ................. 257/77 |
| 6,054,379 A | | 4/2000 | Yau et al. ..................... 438/623 |
| 6,072,227 A | | 6/2000 | Yau et al. ..................... 257/642 |
| 6,140,671 A | * | 10/2000 | Lee ............................... 257/295 |
| 6,147,009 A | * | 11/2000 | Grill et al. .................... 438/780 |

OTHER PUBLICATIONS

US 6,162,742, 12/2000, Cheung et al. (withdrawn).
Girginoudi, et al., "The effect of hydrogen content on the optoelectronic properties of amorphous silicon–carbide films", J. Appli Phys. 69(3), pp. 1490 and 1492 Feb. 1991).
Goldstein, et al., "Properties of p+ microcrystalline films of SiC:H deposited by conventional of glow discharge", Appl. Phys. Lett. 53 (26), pp. 2672 and 2674 (Dec. 1988).
Meikle, et al., "The role of hydrogen dillution in deposition of a SiC:H from silane/ethylene mixtures", J> Apl. Phys. 67(2), pp. 1048 and 1950 (Jan. 1990).
Rynders, et al., "Structure in a SiC:H films prepared from tetramethysilane", J. Appl. Phys. 69 (5), (Mar. 1991).
Tsai, "Characterization of amorphous semiconducting silicon –boron alloys prepared by plasma deposition", Physical Review, Vol. 19, No. 1, The American Physical Society, pp. 2041, 2053 and 2054 (Feb. 15, 1979).
Tsuge, et al., "Improvement in Wide–Gap A–Si:H For High–Efficiency Solar Cells", 3 pages (Apr. 27–May. 1, 1992.
Yamazaki, et al., "AC Conductivity of Undoped a–Si:H and $\mu$AC–Si:H in Connection with Morphology and Optical Degradation", Japanese Journal of Applied Physics, vol. 28, No. 4, pp. 577–585 (Apr. 1989).
Xu, et al., "BLOκ™ —A Low–κ Dielectric Barrier/Etch Stop Film for Copper Damascene Applications", IEEE, 3 pages (1999).

* cited by examiner

Primary Examiner—David Nelms
Assistant Examiner—David Vu
(74) Attorney, Agent, or Firm—Skjerven Morrill MacPherson; David E. Steuber

(57) ABSTRACT

An amorphous material containing silicon, carbon, hydrogen and nitrogen, provides a barrier/etch stop layer for use with low dielectric constant insulating layers and copper interconnects. The amorphous material is prepared by plasma assisted chemical vapor deposition (CVD) of alklysilanes together with nitrogen and ammonia. Material that at the same time has a dielectric constant less than 4.5, an electrical breakdown field about 5 MV/cm, and a leakage current less than or on the order of 1 nA/cm$^2$ at a field strength of 1 Mv/cm has been obtained. The amorphous material meets the requirements for use as a barrier/etch stop layer in a standard damascene fabrication process.

11 Claims, 2 Drawing Sheets

LOW DIELECTRIC CONSTANT ETCH STOP FILMS

TECHNICAL FIELD

This invention relates generally to the fabrication of microelectronic devices, and more specifically to methods for forming etch stop and barrier layers with low dielectric constants and to the composition of the etch stop layers.

BACKGROUND

Microelectronic integrated circuits based on patterned semiconductor materials are continuing to evolve towards devices with an extremely high density of circuit elements per unit volume. As the features of these devices are reduced to smaller sizes, the performance of the materials that constitute the device will critically determine their success. One specific area in need of advancement is the electrical insulator used between the wires, metal lines, and other elements of the circuit. As the distances between the circuit elements become smaller, there will be increased problems due to capacitive coupling (crosstalk) and propagation delay. These difficulties can be avoided by preparing the circuit using an insulating material that possesses a dielectric constant as low as possible. In particular, it is desired that the insulating material possess a dielectric constant below the dielectric constant of about 4 of silicon dioxide, the material that has long been used in integrated circuits as the primary insulating material.

In addition to using low dielectric constant (low k) insulating materials, the next generation of devices will increasingly use copper for the metal interconnects because of the lower resistivity of copper as compared with aluminum, the conductor in current use. In order to prevent diffusion of copper between metal levels in multilevel devices and to prevent diffusion of copper into adjacent dielectric layers, a barrier layer is provided below each copper interconnect level. The barrier level also serves as an etch stop layer in the dielectric etch of the vias, which is a necessary step in the process of fabricating devices. Currently, silicon nitride is typically used as the material for the barrier layer. However, silicon nitride has a dielectric constant around 7. In order to fully exploit low k insulating materials and copper interconnects, an etch stop barrier material with a dielectric constant lower than that of silicon nitride is desired.

Furunura et al. in U.S. Pat. No. 5,103,285 and Loboda et al. in U.S. Pat. No. 5,818,071 teach the use of silicon carbide as an alternative diffusion barrier layer. However, the silicon carbide film conventionally formed by chemical vapor deposition of silane and methane, which typically contains hydrogen, is characterized by high leakage current and low breakdown field. Values for conventional silicon carbide are quoted, for example, by Xu et al., IITC Conference Proceedings, pp. 109–11, (June, 1999) who disclose an alternative barrier/etch stop film composed of silicon, carbon and hydrogen. There remains, however, a need for a material with a low leakage current and high breakdown field that combines the hardness benefits of silicon nitride as an etch stop layer with a dielectric constant lower than that of silicon nitride.

SUMMARY

An amorphous material containing silicon, carbon, hydrogen and nitrogen, denoted a-Si:C:H:N, provides a barrier/etch stop layer for use with low dielectric constant insulating layers and copper interconnects. The material has an elemental composition that is about 15 to 40% silicon, about 20 to 40% carbon, about 25–55% hydrogen, and about 2–20% nitrogen. The amorphous material is prepared by plasma assisted chemical vapor deposition (CVD) of alkylsilanes, such as tetramethylsilane, together with nitrogen and ammonia. Useful process conditions include flow rates of alkylsilane, nitrogen, and ammonia each in the range of about 500 to 2000 standard cubic centimeters per minute (sccm). The ratio of the sum of nitrogen and ammonia flow rates to the alkylsilane flow rate varies between about 0.25:1 and about 2.75:1. Favorable results have been obtained under conditions in which ammonia constitutes at least about 15% of the sum of the nitrogen and ammonia flow rates.

The deposition process provides an a-Si:C:H:N material that at the same time has a dielectric constant less than about 6 and favorable electrical and mechanical properties. Films with a dielectric constant less than about 4.5, that do not experience electrical breakdown at a field strength of about 5 MV/cm, and that have a leakage current less than or on the order of 1 nA/cm$^2$ at a field strength of 1 MV/cm have been obtained. The films have excellent mechanical properties; hardness greater than 8 Gpa and compressive stress as low as 50 Mpa. They also serve as an effective diffusion barrier; no copper diffusion was observed after 26 hours through a 500 Å thick film held at 250° C. at an applied field of 1 MV/cm. In addition, the a-Si:C:H:N film has an etch rate in a standard fluorocarbon dry etch that is at least 2 times slower and as much as 10–12 times slower than the etch rate of silicon dioxide.

The amorphous material meets the requirements for use as a barrier/etch stop layer in a standard damascene fabrication process. The process includes depositing an etch stop layer of a-Si:C:H:N material on a substrate where the substrate has regions of metal conductor and regions of insulating material, depositing a layer of insulating material on the etch stop layer, and etching patterns in the layer of insulating material where the etch stop layer etches at a slower rate than the layer of insulating material. The patterns are then lined and filled with a conductor. In some processes, the amorphous material is also used as an etch stop material within the layer of insulating material, separating a trench level and a via level.

BRIEF DESCRIPTION OF THE DRAWINGS

Use of the same reference number in different figures denotes identical or similar elements.

DETAILED DESCRIPTION

Figure 1A:
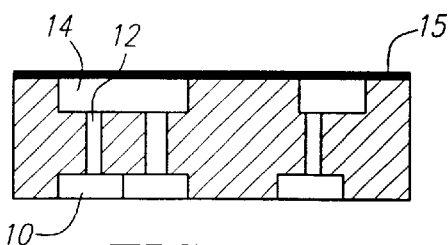
FIGS. 1a–1h are schematic representations of a dual damascene process of fabricating structures with copper interconnects, in which the present invention can be incorporated.

An amorphous material containing silicon, carbon, hydrogen and nitrogen provides a barrier/etch stop layer for use with low dielectric constant insulating layers and copper interconnects. The amorphous material, denoted a-Si:C:H:N, is prepared by chemical vapor deposition (CVD) of substituted silanes together with nitrogen and ammonia.

According to an aspect of the present invention, the barrier/etch stop layer has an elemental composition that is about 15 to 40% silicon, about 20 to 40% carbon, about 25–55% hydrogen, and about 2–20% nitrogen. The amorphous material may optionally contain a trace of oxygen, up to about 0.1%. Preferably, the a-Si:C:H:N material is about 20 to 35% silicon, about 20 to 35% carbon, about 30 to 55% hydrogen, and about 3 to 15% nitrogen; and most preferably, the material is about 20 to 25% silicon, about 22 to 28% carbon, about 35 to 48% hydrogen, and about 5 to 10% nitrogen.

The silicon-containing precursor gas for the chemical vapor deposition of a-Si:C:H:N is an alkylsilane, such as tetramethylsilane, trimethylsilane, dimethylsilane, or methylsilane. A combination of nitrogen and ammonia is used as the nitrogen source. A plasma assisted CVD process is used. As is well known in the art, there are two main types of plasma CVD reactors. When a capacitively coupled parallel plate reactor is used, the deposition process is convnetionally termed plasma enhanced CVD (PECVD). The plasma may be formed in the PECVD reactor by a radio frequency (rf) discharge at a single frequency. A low frequency rf bias may optionalloy be applied, in addition. An example of a PECVD reactor is the Sequel™ reactor of Novellus Systems (San Jose, Calif.). Alternatively, a high density plasma reactor (HDP) in which the plasma is formed by electron cyclotron resonance (ECR) or as an inductively coupled plasma (ICP) may be used. An optional low frequency rf bias may be applied in HDP reactors. An example of an HDP reactor is the Speed™ reactor of Novellus Systems.

Both the ratios of process gases and the plasma deposition conditions have been shown to affect the properties of the resulting film. Films may have the same elemental composition but differ in their electrical properties depending on the process conditions with which they were deposited. The following process conditions are used for the chemical vapor deposition of the present a-Si:C:H:N films. The flow rates of alkylsilane, nitrogen, and ammonia are each in the range of about 500 to 2000 standard cubic centimeters per minute (sccm). The ratio of the sum of nitrogen and ammonia flow rates to the alkylsilane flow rate can vary between about 0.25:1 and about 2.75:1. Processes in which ammonia constitutes at least about 15% of the sum of nitrogen and ammonia have been shown to be beneficial. The rf discharge at the standard 13.56 MHz frequency is operated at a power level of between about 800 and 2500 watts. The power level of the optional low frequency rf bias is up to about 1000 watts. The reactor is operated at a total pressure of between about 4 mTorr and 5 Torr and at a temperature between about 250 and 450° C. Good results have been obtained with a tetramethylsilane flow rate between about 1200 and 1800 sccm, ammonia flow rate between about 1000 and 1400 sccm and nitrogen flow rate between about 1000 and 1500 sccm, where the ratio of the sum of nitrogen and ammonia flow rates to the alkylsilane flow rate is between about 1.1:1 and about 1.6:1 (See Table 1 below). In addition, there is some evidence that the dielectric constant and breakdown field of the resulting film is affected by controlling the flow rate of ammonia.

The present process produces films that at the same time have dielectric constants below 6 and advantageous electrical and mechanical properties for use as barrier/etch stop layers. As shown in particular in Table 2 below, the present process produces a film with a density of at least 1.6 g/cm$^3$, a dielectric constant less than 4.5, that does not experience electrical breakdown at a field strength of about 5 MV/cm, and that has a leakage current less than or on the order of 1 nA/cm$^2$ at a field strength of 1 MV/cm. The film has excellent mechanical properties; hardness greater than 8 Gpa and compressive stress as low as 50 Mpa. No copper diffusion was observed after 26 hours through a 500 Å thick film held at 250° C. at an applied field of 1 MV/cm. In addition, the a-Si:C:H:N film has an etch rate in a standard fluorocarbon dry etch that is at least two times slower and as much as 10–12 times slower than the etch rate of silicon dioxide. Thus, the amorphous film produced by the present process meets the requirements for use as a barrier/etch stop layer in next generation integrated circuit devices.

Figure 1B:
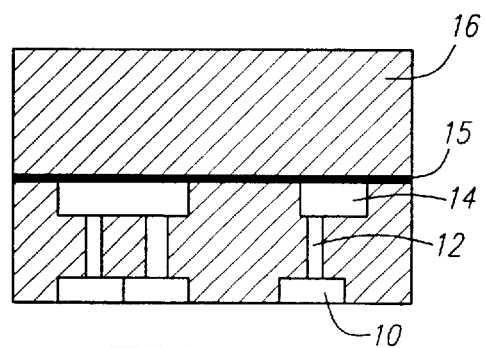

For example, the amorphous film is used as a barrier/etch stop layer in a dual damascene process for fabricating structures with copper interconnects, as illustrated schematically in FIGS. 1a–1h. A first metal layer with devices 10, metal contacts 12, typically, tungsten, and copper conductor 14 is shown in FIG. 1a. A thin layer 15 of a-Si:C:H:N, according to the present invention, serves as an etch stop layer and barrier against diffusion of copper between metal levels. Insulating layer 16 is deposited over the barrier/etch stop layer 15, as shown in FIG. 1b. Insulating layer 16 can be a conventional silicon dioxide layer or a low dielectric constant layer, for example, a carbon doped silicon oxide layer.

Figure 1C:
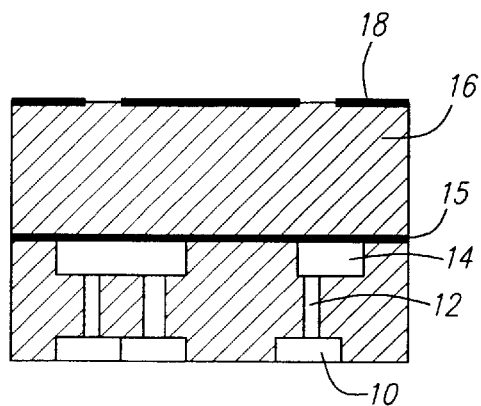
Figure 1D:
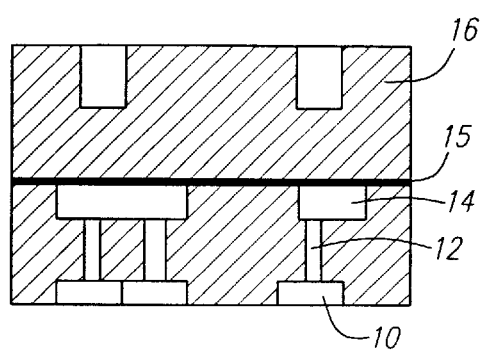
Figure 1E:
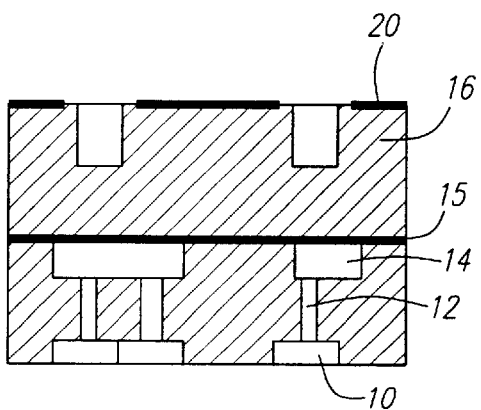

A photoresist layer 18 is deposited over insulating layer 16 and patterned for the vias (FIG. 1c), followed by a via etch through layer 16 (FIG. 1d). Next, a second photoresist layer 20 is deposited and patterned for the trenches (FIG. 1e) and a trench is etched through insulating layer 16 resulting in the pattern shown in FIG. 1f. The trench etch stops on barrier/etch stop layer 15. Because the a-Si:C:H:N material etches at a rate that is 10 times slower than the etch rate of silicon dioxide, it is an excellent etch stop material. Many alternative, low-k insulating layers, such as carbon doped silicon oxide will have etch properties similar to those of conventional silicon dioxide. Thus, a-Si:C:H:N is advantageously used as an etch stop layer with a range of insulating materials.

Figure 2A:
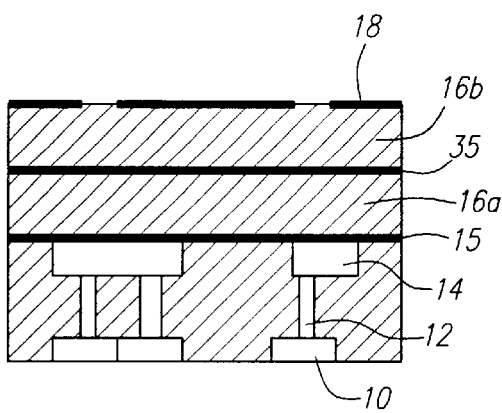
FIGS. 2a and 2b are alternatives for FIGS. 1c and 1d for the case where the trench and via layers of insulating material are separated by an etch stop layer.
Figure 2B:
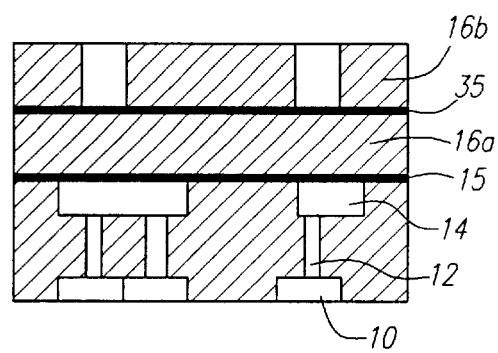

In FIG. 1c a thick insulating layer 16 is shown which will ultimately accommodate both the via and trench levels. Alternatively, the via level 16a and trench level 16b are separated by an etch stop layer 35, as shown in FIG. 2a. The structure shown in FIG. 2a is generated by three separate depositions. Amorphous a-Si:C:H:N is effectively used as etch stop layer 35 in this alternative such that the via etch through the trench level 16b stops on etch stop layer 35, as shown in FIG. 2b.

Figure 1F:
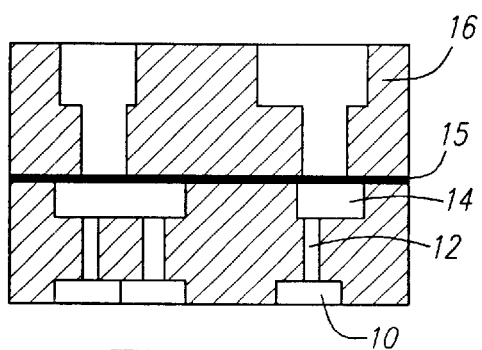
Figure 1G:
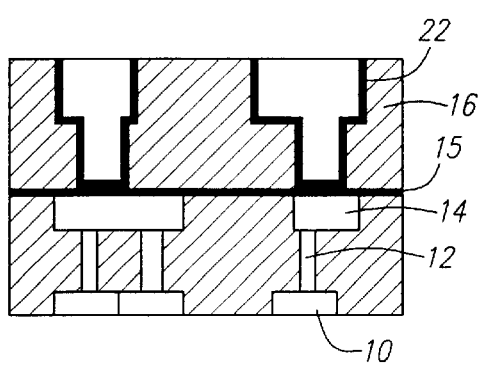
Figure 1H:
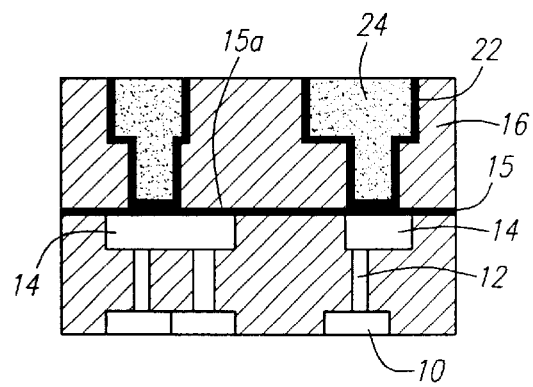

Returning to the process flow in FIGS. 1a–1h, the portion of insulating layer 16 under the vias in FIG. 1f is removed. Next, the trenches and vias are typically lined with a liner metal 22 (FIG. 1g), filled with copper 24, and planarized by chemical mechanical polishing to produce the structure of FIG. 1h. The structure of FIG. 1h includes a region 15a, where insulating layer 16, of the second layer, is separated from copper conductor 14, of the first layer, by barrier/etch stop layer 15. In addition to serving as an etch stop layer, layer 15 provides a barrier to diffusion of copper ions from conductor 14 to insulating layer 16. Such diffusion, if allowed to occur, would degrade performance of the integrated circuit device. Although a two-layer structure is shown in the above example, the a-Si:C:H:N material may be used as a barrier/etch stop layer for any layer of a multilevel device. For example, a layer of a-Si:C:H:N material can be deposited over the top of the structure in FIG. 1h to serve as a barrier/etch stop layer of a third level.

Thus, it may be seen that the amorphous material containing silicon, carbon, hydrogen, and nitrogen provides barrier/etch stop layers with excellent properties for modern fabrication processes. Although the invention has been described with reference to particular examples, the description is only an example of the invention's application and should not be taken as a limitation. Various adaptations and combinations of features of the examples disclosed are within the scope of the invention as defined by the claims following the example below.

EXAMPLES

Amorphous layers containing silicon, carbon, hydrogen, and nitrogen were deposited on 8 inch wafers in a Novellus Systems Inc. Sequel 2™ reactor using a range of process conditions as given below in Table 1. Detailed measurements of film properties for Example B are given in Table 2. Dielectric constant, leakage current, and breakdown field were measured on capacitors formed using sputtered aluminum gate electrodes on 500 Å thick films at a current of 1 mA/cm$^2$. Density was determined by dividing the difference in weight of the wafer before and after deposition by the product of the known area and the measured thickness. Bias temperature stress measurements were performed by applying an electric field to a structure consisting of aluminum electrodes on a 500 Å thick layer of a-Si:C:H:N, overlying a copper layer.

Thus, it is evident, processes according to the present invention provide amorphous films containing silicon, carbon, hydrogen, nitrogen that are characterized by a dielectric constant less than 4.5, a low leakage current, breakdown field of 5 MV/cm and the ability to withstand a bias temperature stress test for over 26 hours. These films are advantageously used as a copper diffusion barrier and etch stop layer in fabricating integrated circuit devices.

We claim:

1. A method of fabricating an integrated circuit device, the method comprising:
   depositing a layer of amorphous material comprising silicon, carbon, nitrogen, and hydrogen by chemical vapor deposition on a surface, the surface comprising at least one of a metal conductor region and an insulating material region;
   depositing a layer of insulating material such that the insulating material is adjacent to the layer of amorphous material; and
   etching patterns in the layer of insulating material wherein the layer of amorphous material etches at a slower rate than the layer of insulating material.

2. The method of claim 1 wherein the amorphous material comprises between about 15% and about 40% silicon, between about 20% and about 40% carbon, between about

TABLE 1

Process Conditions and Film Properties*

| Ex. | NH$_3$ (sccm) | N$_2$ (sccm) | HFRF power (W) | LFRF power (W) | Deposition Rate (Å/min) | k | Leakage (nA/cm$^2$) | Thickness (Å) |
|-----|------|------|------|-----|------|------|-----|------|
| A | 1200 | 1000 | 1500 | 200 | 940 | 4.21 | 1 | 752 |
| B | 1200 | 1000 | 1500 | 300 | 1323 | 4.38 | 1 | 1059 |
| C | 1000 | 1000 | 1500 | 300 | 1311 | 4.52 | 1.3 | 1049 |
| D | 1200 | 1000 | 1700 | 300 | 1470 | 4.33 | 1.3 | 735 |
| E | 1200 | 1000 | 1500 | 400 | 1780 | 4.73 | 1.1 | 890 |
| F | 1200 | 1500 | 1500 | 300 | 1339 | 4.52 | 1.5 | 1071 |
| G | 1200 | 1500 | 1500 | 300 | 1314 | 4.64 | 0.9 | 1051 |
| H | 1200 | 2000 | 2000 | 300 | 1648 | 4.56 | 2 | 824 |

*Tetramethylsilane flow rate 1500 sccm; HFRF at 13.56 MHz; LFRF at 250 kHz

TABLE 2

Process Conditions and Film Properties for Example B

| | |
|---|---|
| Tetramethylsilane flow rate | 1500 sccm |
| Ammonia flow rate | 1200 sccm |
| Nitrogen flow rate | 1000 sccm |
| RF power at 13.56 MHz | 1500 W |
| RF power at 400 kHz | 300 W |
| Temperature | 400° C. |
| Pressure | 4 torr |
| Dielectric constant | 4.38 |
| Density | 1.75 ± 0.15 g/cm$^3$ |
| Breakdown field | 5 MV/cm |
| Leakage current | ~1 nA/cm$^2$ at 1 MV/cm |
| Stress | 50 Mpa compressive |
| Deposition rate | 1323 Å/min |
| Thickness uniformity | 1.5% (9 points) 2.5% (49 points) |
| Thickness shrinkage | <0.5% after 400° C. anneal for 4 hours |
| Cracking thickness | >2 microns |
| Stud pull on Cu | 6–9.3 kpsi |
| Stud pull on SiO$_2$ | 7.2–9.7 kpsi |
| Hardness | 8 Gpa |
| Atomic composition | Si 23% H 41% C 25% N 8% |
| Bias temperature stress at IMV/cm, 250° C. | >26 hours |

25% and about 55% hydrogen and between about 2% and about 20% nitrogen.

3. The method of claim 1 wherein the amorphous material responds to a fluorocarbon etch at a rate that is at least two times slower than the rate at which the layer of insulating material responds.

4. The method of claim 1 wherein the insulating material has a dielectric constant below 7.

5. The method of claim 2 wherein the layer of amorphous material is deposited using process gases comprising an alkylsilane, nitrogen, and ammonia.

6. The method of claim 5 wherein the alkylsilane is tetramethylsilane and the ratio of the sum of the flow rate of nitrogen and ammonia to the flow rate of tetramethylsilane is between about 0.25:1 and about 2.75:1.

7. The method of claim 6 wherein the flow rate of ammonia is at least about 15% of the sum of the flow rates of nitrogen and ammonia.

8. The method of claim 5 wherein the layer of amorphous material has a dielectric constant less than about 6 and does not experience electrical breakdown at a field strength of 5MV/cm.

9. The method of claim 8 wherein the layer of amorphous material has a density of at least about 1.6 g/cm$^3$ and a hardness of at least about 8 gigapascals.

10. The method of claim 1 further comprising:
    filling the etched patterns in the layer of insulating material with metal; and depositing a layer of amorphous material comprising silicon, carbon, nitrogen, and hydrogen by chemical vapor deposition on the metal filled layer of insulating material.

11. The method of claim 1 further comprising depositing an etch stop layer comprising silicon, carbon, nitrogen, and hydrogen by chemical vapor deposition on the layer of insulating material;

depositing a trench level layer of insulating material on the etch stop layer, and etching a via pattern in the trench level layer of insulating material wherein the etch stop layer etches at a rate that is slower than the rate at which the trench level layer of insulating material etches.

* * * * *